(12) United States Patent
Kim et al.

(10) Patent No.: US 10,453,728 B2
(45) Date of Patent: Oct. 22, 2019

(54) EXCHANGE AND FLIP CHAMBER DESIGN FOR HETEROJUNCTION SOLAR CELL FORMATION

(71) Applicant: Applied Materials, Inc., Santa Clara, CA (US)

(72) Inventors: Kyung-Tae Kim, Suwon (KR); Su Ho Cho, Santa Clara, CA (US); Tsunehiko Kitamura, Santa Clara, CA (US); Shinobu Abe, Osaka (JP); Shuran Sheng, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/812,922

(22) Filed: Nov. 14, 2017

(65) Prior Publication Data
US 2018/0144966 A1 May 24, 2018

Related U.S. Application Data

(60) Provisional application No. 62/424,196, filed on Nov. 18, 2016.

(51) Int. Cl.
| | | |
|---|---|---|
| C23C 16/00 | (2006.01) | |
| H01L 21/677 | (2006.01) | |
| H01L 31/18 | (2006.01) | |
| H01L 21/67 | (2006.01) | |

(52) U.S. Cl.
CPC .... *H01L 21/67796* (2013.01); *H01L 21/6719* (2013.01); *H01L 21/6776* (2013.01); *H01L 21/67712* (2013.01); *H01L 21/67718* (2013.01); *H01L 31/18* (2013.01); *Y02P 70/521* (2015.11)

(58) Field of Classification Search
CPC .............. H01L 21/67796; H01L 31/18; H01L 21/6719; H01L 21/67712; H01L 21/67718; H01L 21/6776
See application file for complete search history.

(56) References Cited

U.S. PATENT DOCUMENTS

| | | |
|---|---|---|
| 6,719,851 B1 | 4/2004 | Kurita et al. |
| 7,067,892 B1 | 6/2006 | Michalicek |
| 2008/0003082 A1 | 1/2008 | Motoshima et al. |
| 2010/0087028 A1 | 4/2010 | Porthouse et al. |
| 2011/0114473 A1* | 5/2011 | Iwasaki ............... C23C 14/3485 204/192.12 |
| 2014/0079514 A1* | 3/2014 | Polyak .............. H01L 21/67201 414/217 |

FOREIGN PATENT DOCUMENTS

WO 2015127191 A1 8/2015

OTHER PUBLICATIONS

International Search Report and Written Opinion for Application No. PCT/US2017/061616 dated Feb. 9, 2018.

* cited by examiner

*Primary Examiner* — Richard A Booth
(74) *Attorney, Agent, or Firm* — Patterson + Sheridan LLP

(57) ABSTRACT

In one embodiment, a chamber is provided that includes a chamber body and a lid defining an interior volume, a frame within the interior volume, the frame sized to receive a plurality of substrates in a first orientation, and a rotational drive assembly coupled to the frame for rotating the frame and flipping each of the plurality of substrates to a second orientation that is different than the first orientation.

16 Claims, 16 Drawing Sheets

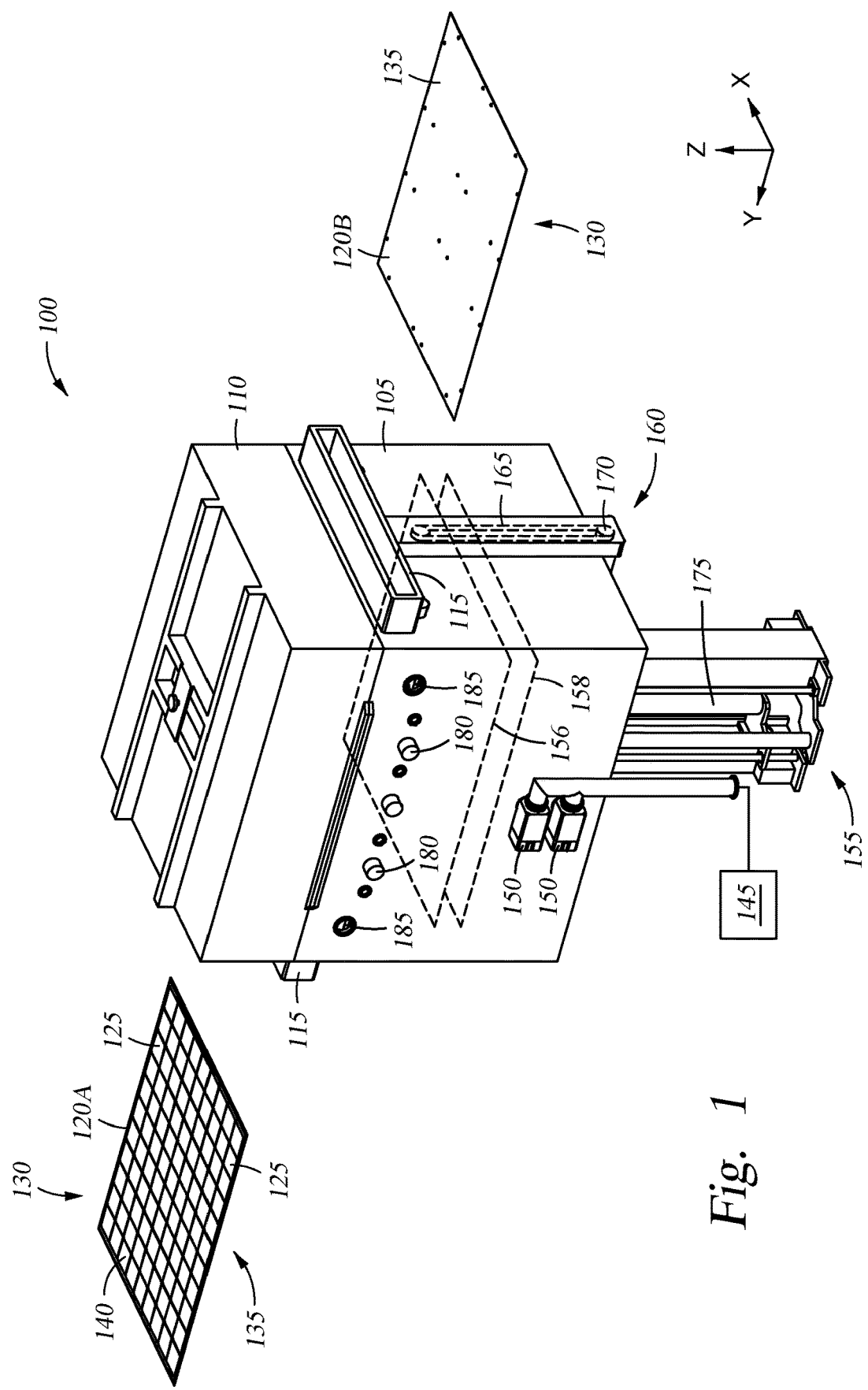

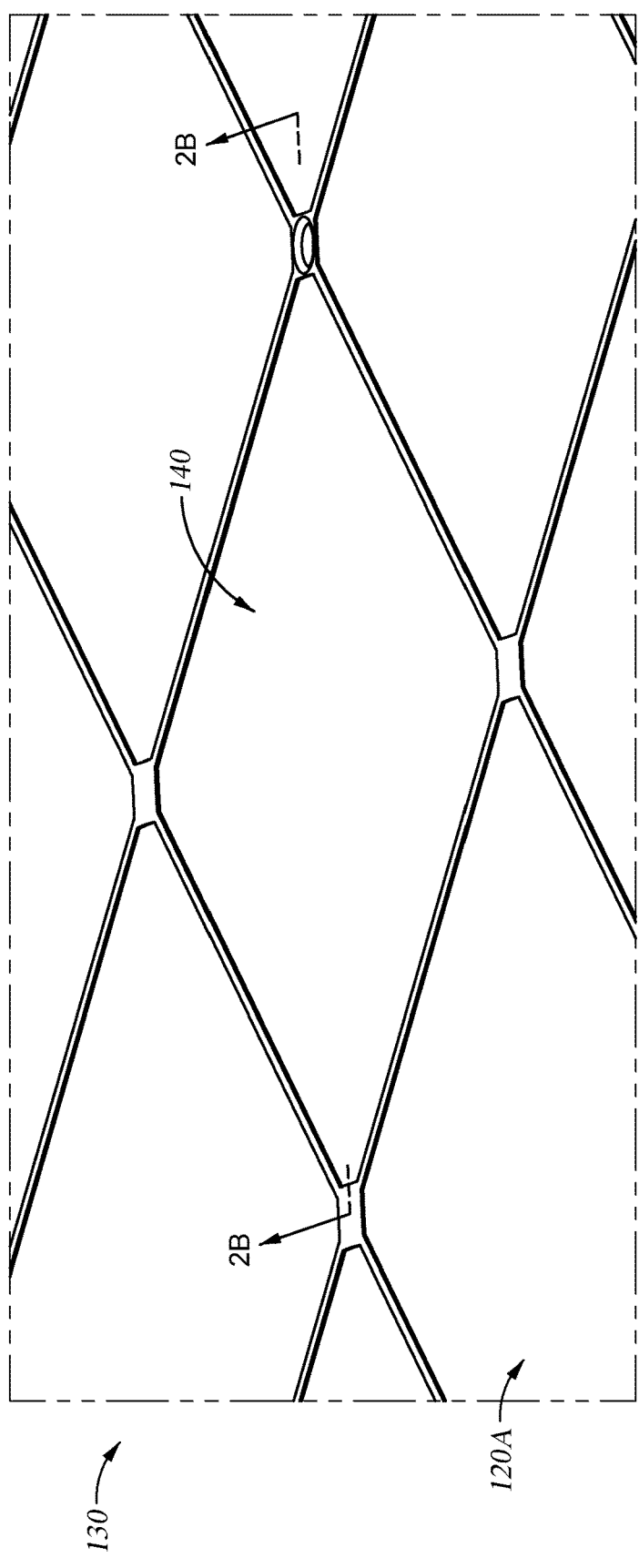
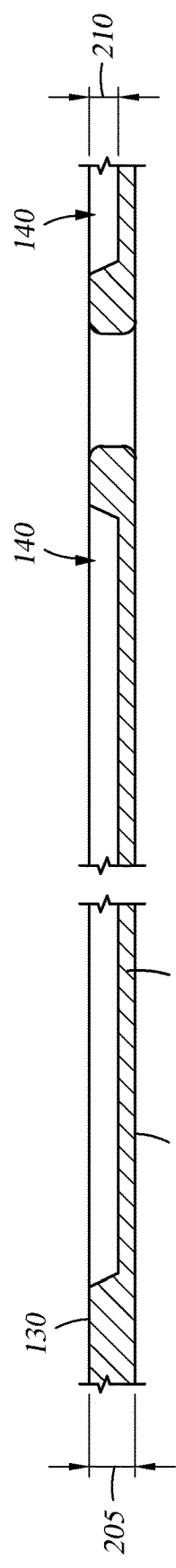
Fig. 2A
Fig. 2B

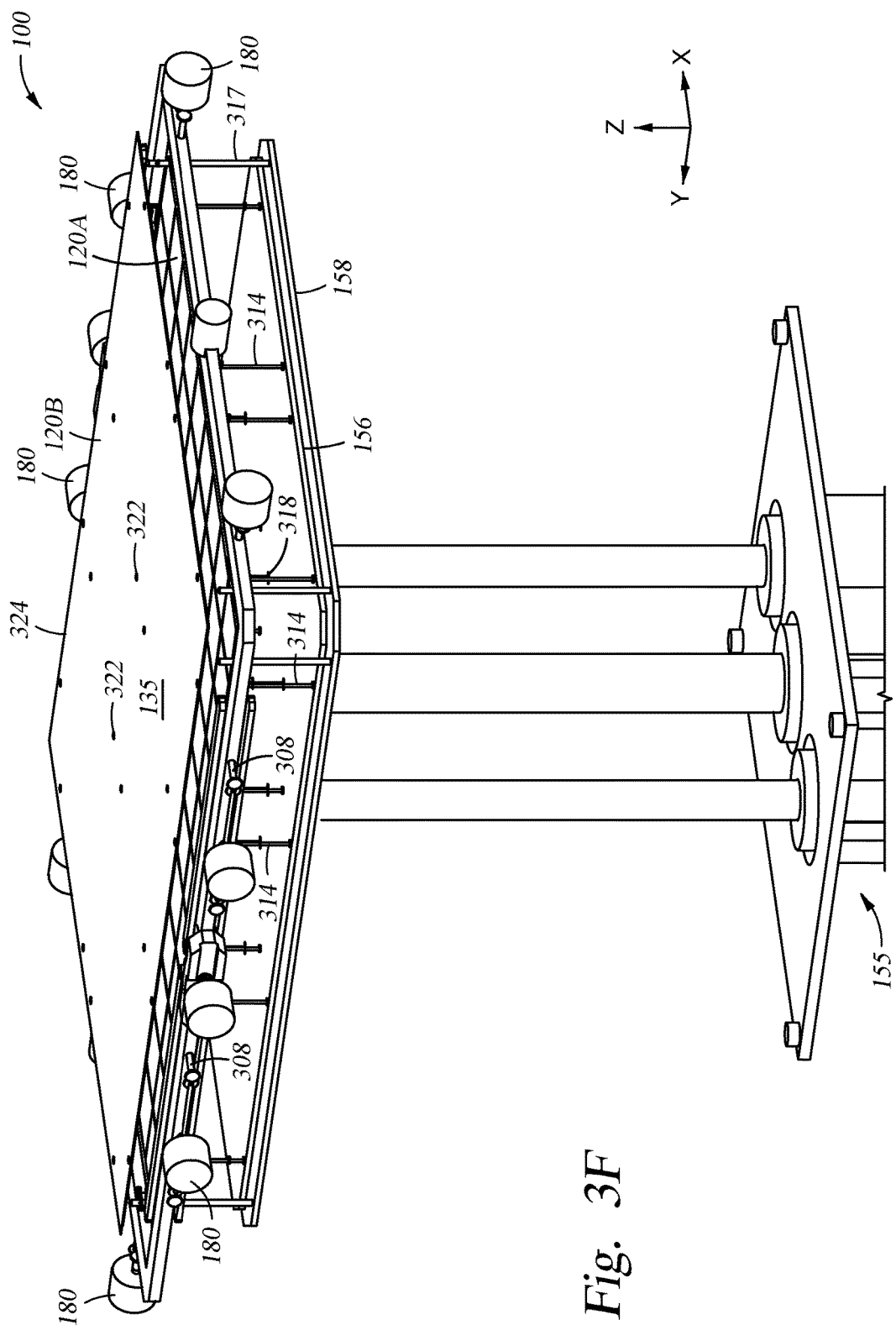

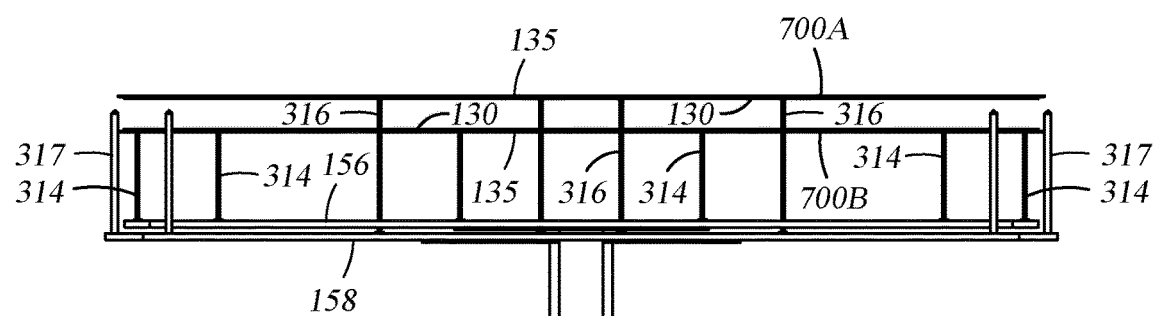
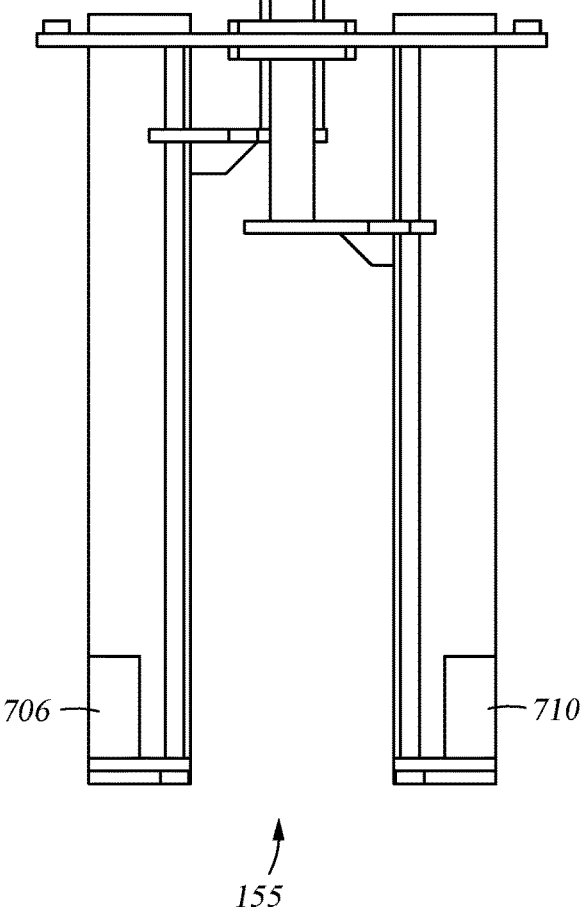
Fig. 7

EXCHANGE AND FLIP CHAMBER DESIGN FOR HETEROJUNCTION SOLAR CELL FORMATION

CROSS-REFERENCE TO RELATED APPLICATION

This application claims benefit of U.S. Provisional Patent Application Ser. No. 62/424,196, filed Nov. 18, 2016, which is incorporated by reference herein.

BACKGROUND

Field

Embodiments of the disclosure generally relate to a chamber for exchanging a substrate carrier with one or more other substrate carriers to facilitate front side deposition and back side deposition on a plurality of substrates. More specifically, embodiments herein generally relate to a chamber for rotating a substrate carrier to place one major side thereof in a face up orientation and the other major side thereof in a face down orientation.

Description of the Related Art

Solar cells are photovoltaic (PV) devices that convert sunlight directly into electrical power. The most common solar cell material is silicon, which is in the form of single or multicrystalline substrates. Because the amortized cost of forming silicon-based solar cells to generate electricity is currently higher than the cost of generating electricity using traditional methods, it is desirable to reduce the cost to form solar cells.

Solar cells typically have one or more p-n junctions. Each p-n junction comprises two different regions within a semiconductor material where one side of the substrate is denoted as the p-type region and the other as the n-type region. When the p-n junction of a solar cell is exposed to sunlight (consisting of energy from photons), the sunlight is directly converted to electricity through the PV effect.

Forming the p-n junctions requires deposition on different (e.g., opposing) sides of a substrate. Typically, the formation process requires changing the orientation of the substrate (e.g., "flipping" the substrate) to enable deposition on each side. The flipping process requires the substrate to be physically handled in order to properly position the substrate. In addition, when a substrate carrier is used to support multiple substrates during deposition, the carrier utilized for the p or n deposition should be exchanged with another carrier to avoid cross-contamination. Currently, the multiple substrates on a carrier are flipped and transferred to another carrier in a semi-automatic process and/or at atmospheric conditions. For example, the substrates may be flipped and transferred using a vacuum gripper or other pick-and-place device. This transfer process is time-consuming and may expose the substrate to atmospheric gases and/or moisture, which may lower the quality of the resulting solar cell.

Thus, there is a need for an improved method and apparatus for exchanging and reorienting substrates.

SUMMARY

In one embodiment, a chamber is provided that includes a chamber body and a lid defining an interior volume, a frame within the interior volume, the frame sized to receive a plurality of substrates in a first orientation, and a rotational drive assembly coupled to the frame for rotating the frame and flipping each of the plurality of substrates to a second orientation that is different than the first orientation.

In another embodiment, a chamber is provided that includes a chamber body and a lid defining an interior volume, a frame within the interior volume, the frame sized to receive a first carrier having a plurality of substrates disposed in the first carrier in a face-up orientation, a second carrier disposable over the first carrier, and a rotational drive assembly coupled to the frame for rotating the first carrier and the second carrier.

In another embodiment, a method for transferring a plurality of substrates is provided that includes transferring a first carrier to a frame structure within a chamber, wherein the first carrier includes a plurality of substrates disposed in a face-up orientation, transferring a second carrier to the frame structure in a position adjacent to the first carrier, and rotating the frame structure to move the plurality of substrates to the second carrier.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 is an isometric view of a chamber according to one embodiment.

FIG. 2A is a partial isometric view of the first carrier according to one embodiment.

FIG. 2B is a partial cross-sectional view of the first carrier along lines 2B-2B of FIG. 2A.

FIG. 3F shows the second carrier positioned above the second lift pins of the second lift plate.

FIG. 7 is a schematic side view of the linear drive assembly coupled to the first lift plate and the second lift plate.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 3A:
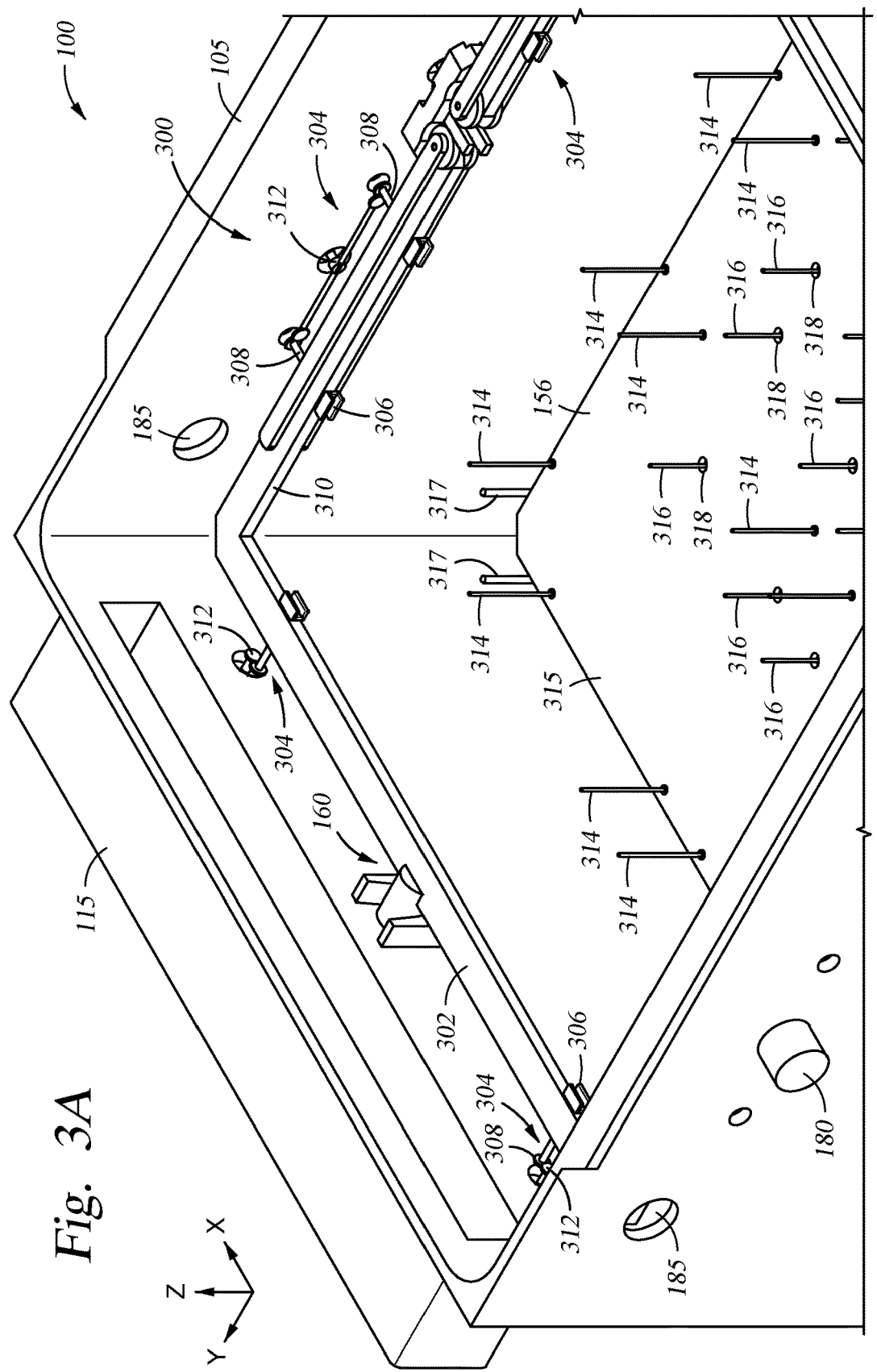
FIG. 3A is an isometric top view of a portion of the chamber of FIG. 1.

Embodiments of the disclosure relate to a chamber that performs a carrier exchange process and a substrate reorientation (flipping) process. The carriers may support and transfer multiple substrates. Pressure in the chamber may be maintained at sub-atmospheric pressures during the exchange and flipping process. The chamber may be coupled to a transfer chamber that is part of a cluster tool or a linear processing system. Alternatively, the chamber may be positioned between transfer chambers of at least two cluster tools or linear processing systems.

FIG. 1 is an isometric view of a chamber 100 according to one embodiment. The chamber 100 includes a chamber body 105 and a lid 110. The chamber body 105 includes carrier transfer ports 115 that are sized to allow carriers 120A and 120B to pass therethrough. The first carrier 120A contains a plurality of substrates 125. Each of the carriers 120A and 120B include a first major side 130 and an opposing second major side 135. The first major side 130 may include depressed areas or pockets 140 each containing or adapted to contain one substrate 125. The second major side 135 may be flat or planar.

Each of the plurality of substrates 125 on the first carrier 120A may include a silicon wafer having an n-doped layer exposed (at an upper surface opposing a surface facing the first carrier 120A). The first carrier 120A may be supported and transferred into the chamber body 105 by a transfer robot (not shown). Likewise, the second carrier 120B may be supported and transferred into the chamber body 105 by another transfer robot (not shown). Once in the chamber 100, the substrates 125 may be transferred out of the pockets 140 of the first carrier 120A and into pockets (not shown) formed in or on the first major side 130 of the second carrier 120B via flipping the first carrier 120A and second carrier 120B 180 degrees. As described in greater detail below, the first carrier 120A may then be transferred out of the chamber body 105. The second carrier 120B may also be transferred out of the chamber body 105 with the first major side 130 facing up (similar to the first carrier 120A depicted in FIG. 1). The substrates 125 will be positioned in the pockets 140 of the second carrier 120B with the n-doped layer down or facing the first major side 130 of the second carrier 120B in order to prepare the exposed surface of the substrates 125 for subsequent deposition processes. For example, the substrates 125 may be transferred on the second carrier 120B to a deposition chamber for p-doping in a process of forming a heterojunction solar cell thereon.

As described above, the chamber 100 may be positioned between two transfer chambers (not shown) as part of a pair of cluster tools or linear deposition systems (both not shown). The carrier transfer ports 115 may be coupled to a port of each of the transfer chambers. The transfer chambers coupled thereto may be maintained at sub-atmospheric pressures. The chamber 100 may also be maintained at sub-atmospheric pressures via coupling an interior volume thereof with a vacuum pump 145. In one embodiment, the pressure maintained within the chamber 100 may be substantially the same as a pressure within the transfer chambers. In one embodiment, the pressure within the chamber 100 may be maintained at less than 1 Torr. The vacuum pump 145 may be coupled to one or more valves 150. As the volume of the chamber 100 is about 8,000 liters, the multiple valves 150 serve to save pump down time. While the chamber 100 may be operated at vacuum pressures, the chamber 100 may also be operated at ambient pressures as well.

The chamber 100 also includes a linear drive assembly 155 that is coupled to lift plates 156, 158 within the chamber 100. The chamber 100 also includes one or more rotational drive assemblies 160 (only one is shown) on sidewalls of the chamber 100. Each rotational drive assembly 160 may include an endless drive member 165 such as a belt. The endless drive member 165 is coupled between a roller 170 and a frame (not shown) within the chamber 100. The frame is utilized to hold the first carrier 120A and the second carrier 120B and rotate the carriers 120A and 120B 180 degrees within the chamber 100 utilizing the rotational drive assemblies 160. The linear drive assembly 155 may include a shaft assembly 175 that couples to both of the lift plates 156, 158. The lift plates 156, 158 are utilized to transfer the first carrier 120A and the second carrier 120B into and out of the frame, and to and from a transfer robot (not shown). The chamber 100 also includes actuators 180 that may be selectively coupled with clamps (not shown) within the chamber 100. The clamps may be used to secure the carriers 120A and 120B to the frame (not shown). Details of the transfer and flipping of the carriers 120A and 120B will be discussed in greater detail below. The chamber 100 may also include one or more view ports 185.

FIG. 2A is a partial isometric view of the first carrier 120A and FIG. 2B is a partial cross-sectional view of the first carrier 120A along lines 2B-2B of FIG. 2A. The second carrier 120B may be constructed similarly to the first carrier 120A with exceptions discussed below. The first carrier 120A includes a body 200 that may be made of graphite. As described above, the first carrier 120A includes the pockets 140 formed in the body 200 where a substrate (not shown) may be positioned. The body 200 includes a depth dimension 205 of about 5 millimeters (mm). Each pocket 140 may also include a depth dimension 210 of about 0.5 mm. In one embodiment, each substrate 125 may include a thickness of about 0.2 mm and fit within each pocket such that a surface thereof is about 0.3 mm below the first major side 130. In one embodiment, the length and width of the first carrier 120A is about 1.5 meters×1.85 meters.

FIG. 3A is an isometric top view of a portion of the chamber 100 of FIG. 1. The lid 110 (shown in FIG. 1) as well as other exterior portions of the chamber 100 is removed in order to show an interior volume 300 of the chamber 100. A portion of a support member or frame 302 is shown as well as an upper or first lift plate 156. While not completely shown in FIG. 3A, the frame 302 may be rectangular (have four sides). A plurality of clamp assemblies 304 are shown coupled to the frame 302. Each of the clamp assemblies 304 include at least one clamp 306 coupled to a clamp shaft 308. Each clamp assembly 304 is coupled to an actuator 180 (only one is shown) by one or more of the clamp shafts 308. The clamps 306 are positioned within an inner perimeter 310 of the frame 302. The clamps 306 may be sized to receive a thickness of both of the carriers 120A and 120B when positioned within the frame 302.

Each of the shafts 308 may include a biasing member (not shown), such as a spring, that biases the clamps 306 toward a center of the frame 302. In this position, the clamps 306 hold both of the carriers 120A and 120B (not shown) within the frame. However, when the actuators 180 are activated, an actuator shaft 312 pulls the clamp shaft 308 outwardly and/or away from the center of the frame 302. This outward force pulls the clamps 306 out of contact with the carriers 120A and 120B such that the carriers 120A and 120B are free from the frame 302. When unclamped, the carriers 120A and 120B may be supported by the first lift plate 156.

The first lift plate 156 includes a plurality of first lift pins 314 that are mounted to a surface 315 of the first lift plate 156 facing the frame 302. A lower or second lift plate 158 (not shown in FIG. 3A but shown in FIG. 1) is positioned further away from the frame 302. Both of the first lift plate 156 and the second lift plate 158 are coupled to the linear drive assembly 155 (shown in FIG. 1). The linear drive assembly 155 is adapted to lift or lower the first lift plate 156 and the second lift plate 158 in the Z direction separately or together. The second lift plate 158 includes a plurality of second lift pins 316 positioned in a different pattern than a pattern of the first lift pins 314. The second lift pins 316 are laterally spaced apart from the first lift pins 314. The first lift pins 314 are disposed in a pattern that may be utilized to contact the second major side 135 (shown in FIG. 1) of the carriers 120A and 120B in order to support one or both of the carriers 120A and 120B relative to the frame 302. The second lift pins 316 may be used to support one of the carriers 120A and 120B relative to the other. The first lift plate 156 includes a plurality of openings 318 formed therethrough that are sized to let the second lift pins 316 pass therethrough. Thus, the second lift plate 158 may be used independently of the first lift plate 156 as will be explained in greater detail below.

In some embodiments, the second lift plate 158 includes alignment pins 317 (two are shown in FIG. 3A). The alignment pins 317 may be positioned outwardly from the second lift pins 316 of the second lift plate 158. The alignment pins 317 may be shorter in length than the second lift pins 316. The alignment pins 317 may be used for minimizing movement of the first carrier 120A. For example, the first carrier 120A may be set on second lift pins 316 mounted on the first lift plate 156. The alignment pins 317 may be utilized to hold and/or align the first carrier 120A to prevent lateral movement thereof.

Figure 3B:
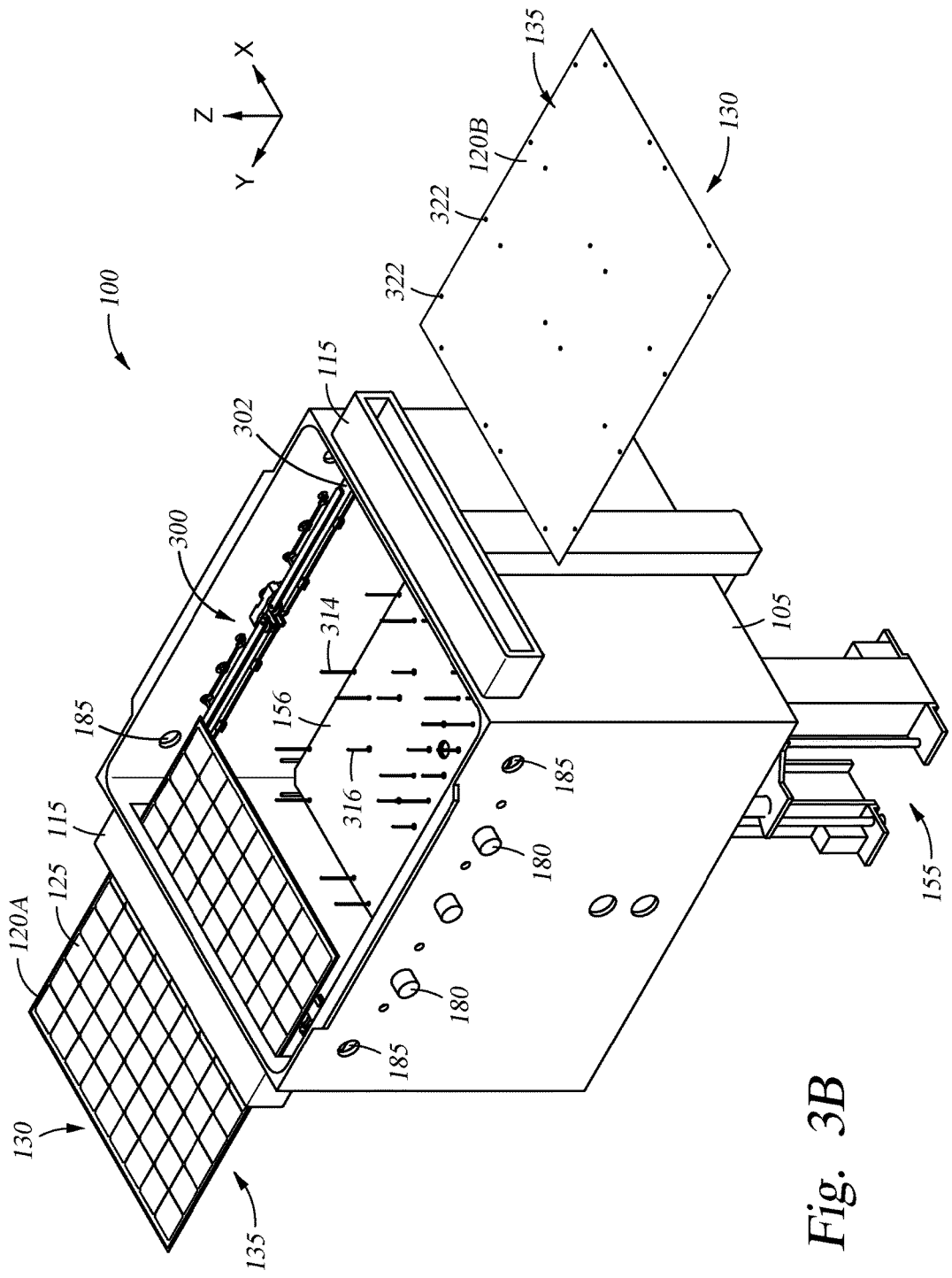
FIG. 3B shows the first carrier being transferred into the interior volume of the chamber.

FIG. 3B shows the first carrier 120A being transferred into the interior volume 300 of the chamber 100. The first carrier 120A may be supported by a transfer robot (not shown). The first carrier 120A may enter the chamber 100 at a plane above a plane of the frame 302.

Figure 3C:
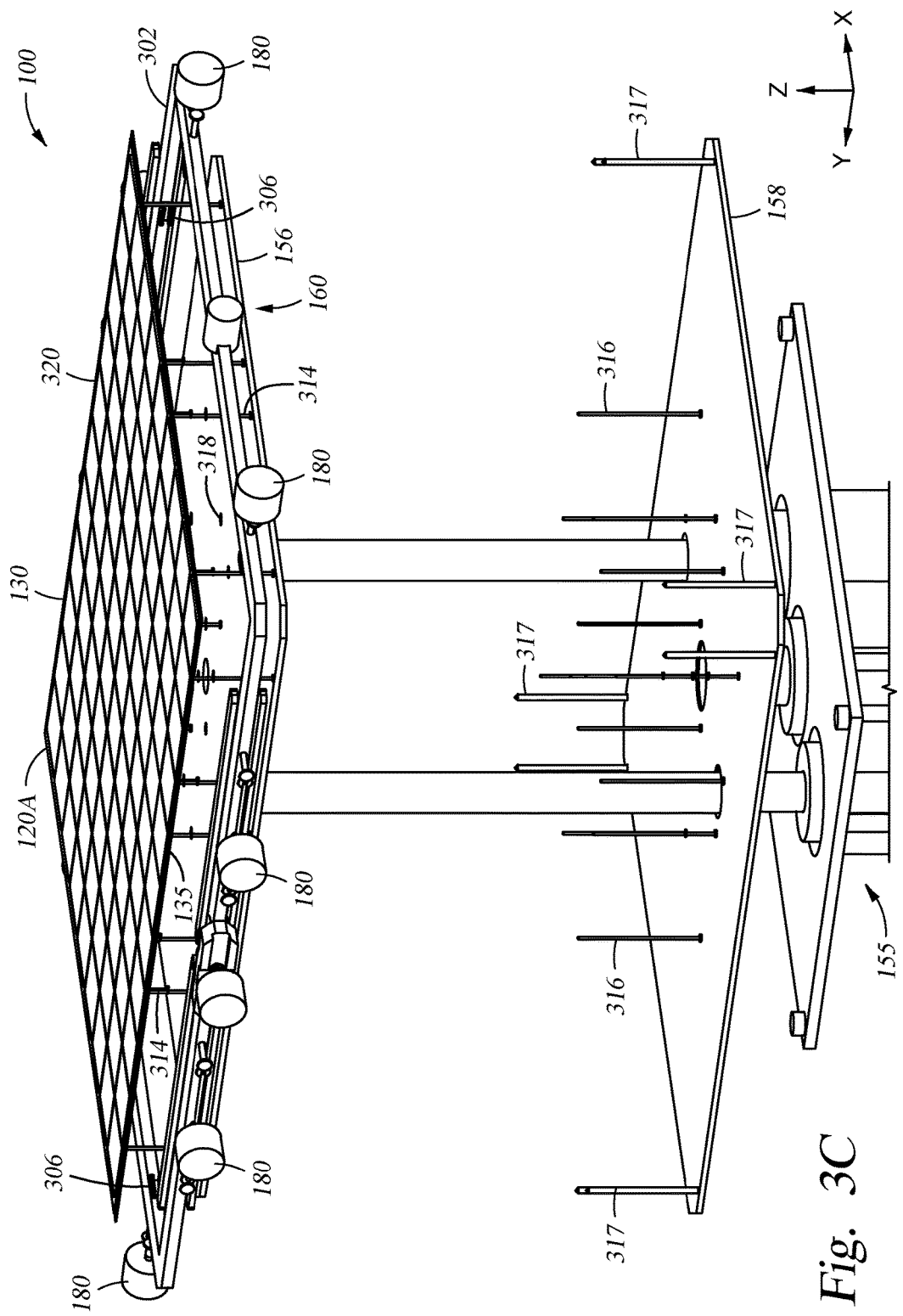
FIG. 3C shows the first carrier being supported above the frame.
Figure 3D:
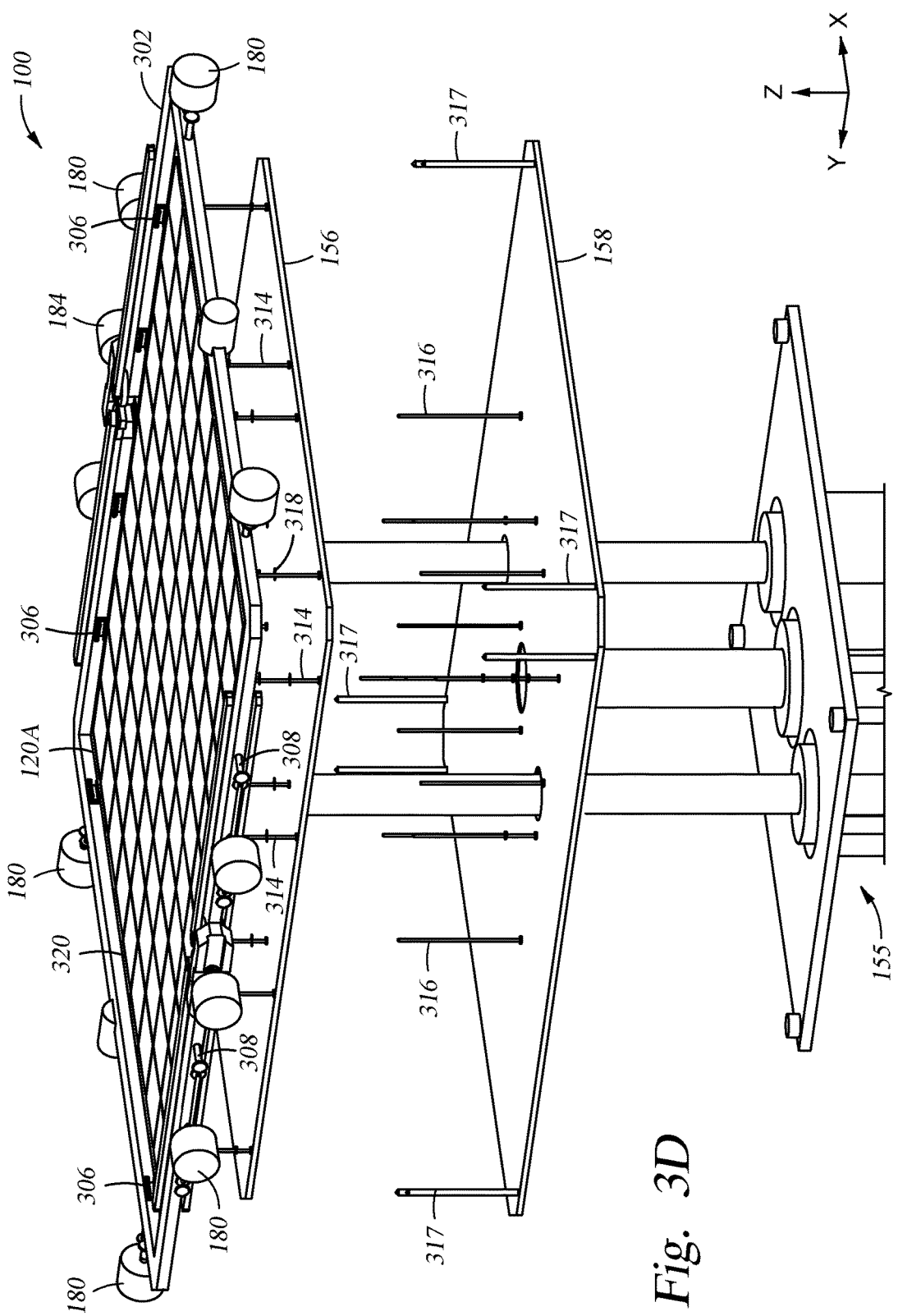
FIG. 3D shows the first lift plate, with the first carrier supported thereon, lowered by the linear drive assembly.

FIGS. 3C and 3D depicts the chamber 100 without the chamber body 105 and lid 110 in order to show the transfer of the first carrier 120A to the frame 302 In FIG. 3C, the first carrier 120A is supported by the transfer robot (not shown) above the frame 302. The first carrier 120A is brought into proximity of the frame 302 and positioned to be concentric with the frame 302. The first lift plate 156 is moved in the Z direction by the linear drive assembly 155 toward the second major side 135 of the first carrier 120A. The first lift pins 314 extend through the inner perimeter 310 of the frame 302 below the first carrier 120A. Transfer of the first carrier 120A to the first lift pins 314 of the first lift plate 156 may be accomplished by movement of the transfer robot (not shown) downward (in the Z direction) in order to place the first carrier 120A onto the first lift pins 314. Alternatively, the first lift plate 156 may be raised such that the first lift pins 314 contact the second major side 135 of the first carrier 120A and lift the first carrier 120A from the transfer robot.

Once the first carrier 120A is supported by the first lift pins 314, the transfer robot may move away from the first carrier 120A and retract out of the chamber 100. The clamps 306 may be retracted by the actuators 180 such that a perimeter 320 of the first carrier 120A may pass thereby to a position shown in FIG. 3D.

In FIG. 3D, the first lift plate 156, with the first carrier 120A supported thereon, is lowered (in the Z direction) by the linear drive assembly 155. The first lift plate 156 lowers the first carrier 120A to be in the same plane as the frame 302. The second lift plate 158 may also be raised (in the Z direction) towards the first carrier 120A. The second lift plate 158 is raised such that the second lift pins 316 extend through the openings 318 in the first lift plate 156 as shown in FIG. 3E.

Figure 3E:
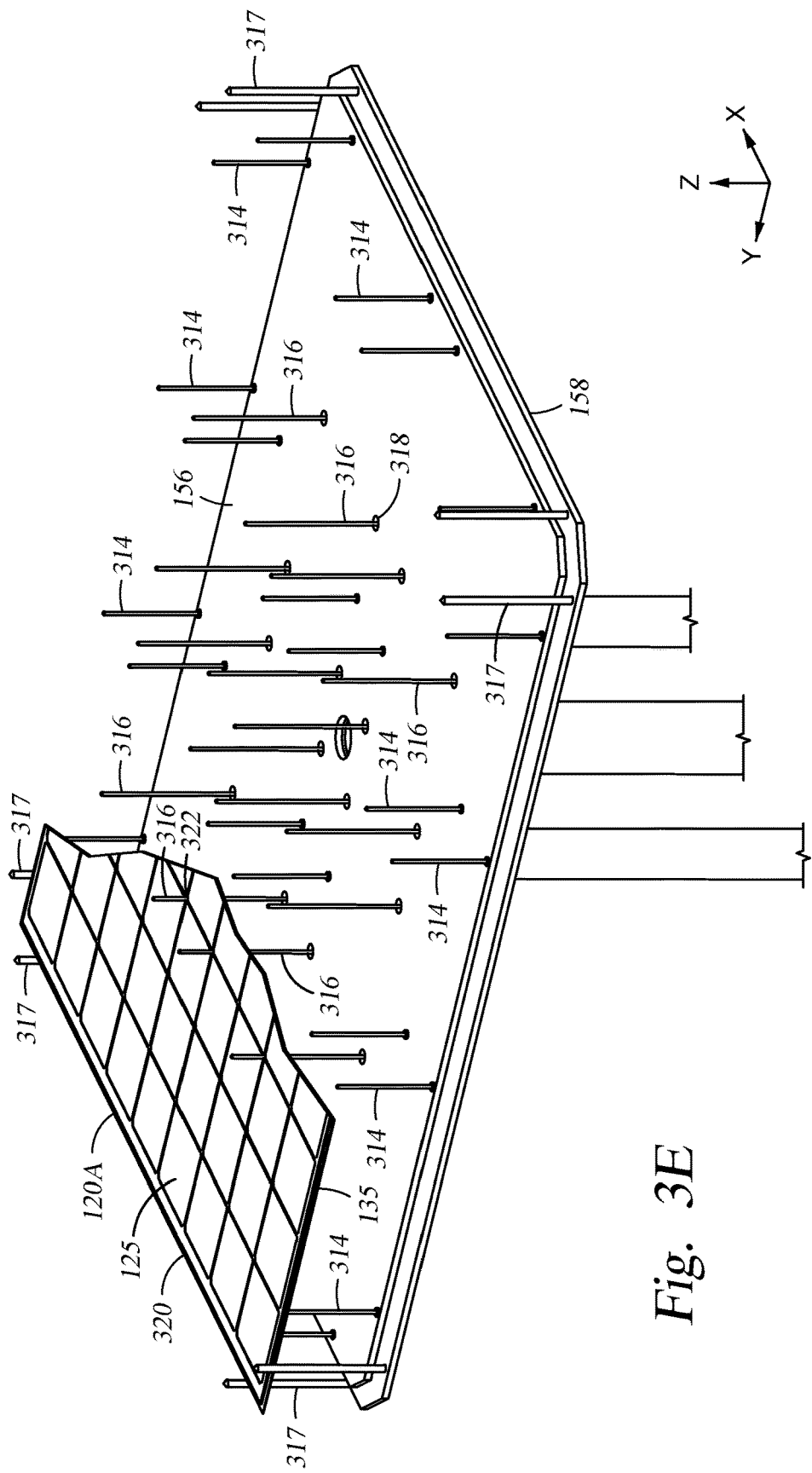
FIG. 3E shows the first lift plate adjacent to the second lift plate with the second lift pins extending through the openings of the first lift plate.

FIG. 3E shows the first lift plate 156 adjacent to the second lift plate 158 with the second lift pins 316 extending through the openings 318 of the first lift plate 156. A portion of the first carrier 120A is shown. The first carrier 120A has a plurality of perforations 322 (only one is shown) where a portion of the second lift plate 158 may extend therethrough. When the second lift plate 158 is placed in proximity to the first lift plate 156 (which is supporting the first carrier 120A), a portion of the second lift pins 316 extend through the perforations 322 to a position above the plane of the first carrier 120A. Another portion of the second lift pins 316 extend past the plane of the first carrier 120A about the perimeter 320 of the first carrier 120A. When extended through the perforations 322 and/or about the perimeter 320 of the first carrier 120A, the second lift pins 316 are in position to receive the second carrier 120B as shown in FIG. 3F.

Figure 3G:
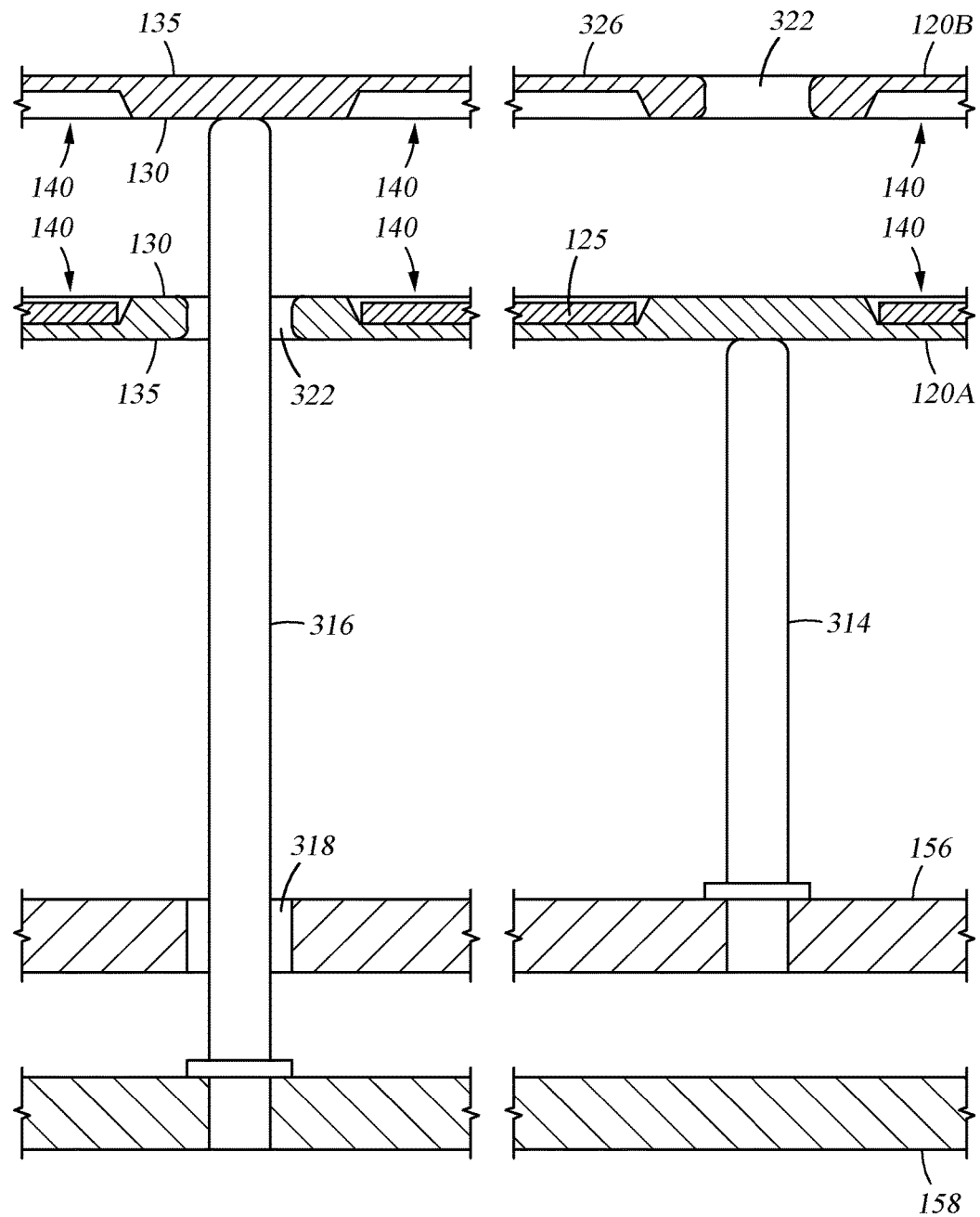
FIG. 3G is a side cross-sectional view of a portion of the first carrier supported by the first lift pins of the first lift plate, and a portion of the second carrier supported by the second lift pins of the second lift plate.

FIG. 3F shows the second carrier 120B positioned above the second lift pins 316 of the second lift plate 158. The second carrier 120B may be supported by a transfer robot (not shown) in the position shown in FIG. 3F. Transfer of the second carrier 120B to the second lift pins 316 of the second lift plate 158 may be accomplished by movement of the transfer robot downward (in the Z direction) in order to place the second carrier 120B onto the second lift pins 316. Alternatively, the second lift plate 158 may be raised such that the second lift pins 316 contact the second major side 135 of the second carrier 120B and lift the second carrier 120B from the transfer robot. Once the second carrier 120B is supported by the second lift pins 316 as shown in FIG. 3G, the transfer robot may move away from the second carrier 120B and retract out of the chamber 100. The clamps 306 may remain retracted by the actuators 180 such that a perimeter 324 of the second carrier 120B may pass thereby to a position shown in FIG. 3H.

FIG. 3G is a side cross-sectional view of a portion of the first carrier 120A supported by the first lift pins 314 of the first lift plate 156, and a portion of the second carrier 120B supported by the second lift pins 316 of the second lift plate 158. Both of the first carrier 120A and the second carrier 120B have the perforations 322. The perforations 322 in the first carrier 120A and the second carrier 120B are formed in sidewalls 326 of the pockets 140. However, the perforations 322 are at different positions depending on the orientation of the respective carriers. For example, when the first carrier 120A has the second major side 135 facing the first lift plate 156, the second lift pins 316 are adapted to pass through the perforations 322 in the first carrier 120A. When the second major side 135 of the second carrier 120B is facing the first lift plate 156, the second lift pins 316 are adapted to pass through the perforations 322 in the second carrier 120B. As described herein, the substrates 125 supported by the first carrier 120A are to be transferred to the pockets 140 of the second carrier 120B by a flipping process described below. To accomplish the transfer, the second carrier 120B should be above the first carrier 120A as shown. However, the substrates 125 may be supported by the pockets 140 of the second carrier 120B and then be transferred to the first carrier 120A. In this configuration, the positions and orientations of the first carrier 120A and the second carrier 120B may be switched as shown in FIG. 3G. Thus, when the second carrier 120B is supporting substrates 125, the first carrier 120A would be above the second carrier 120B, and the perforations 322 in the second carrier 120B would be aligned with the second lift pins 316 in order to support the first carrier 120A.

Returning to FIG. 3G, the first carrier 120A and the second carrier 120B should be brought into proximity with each other in order to facilitate the substrate transfer process. Specifically, the first major sides 130 of the first carrier 120A and the second carrier 120B should be brought into proximity with each other. Additionally, the pockets 140 of each of the first carrier 120A and the second carrier 120B should be aligned.

Figure 3H:
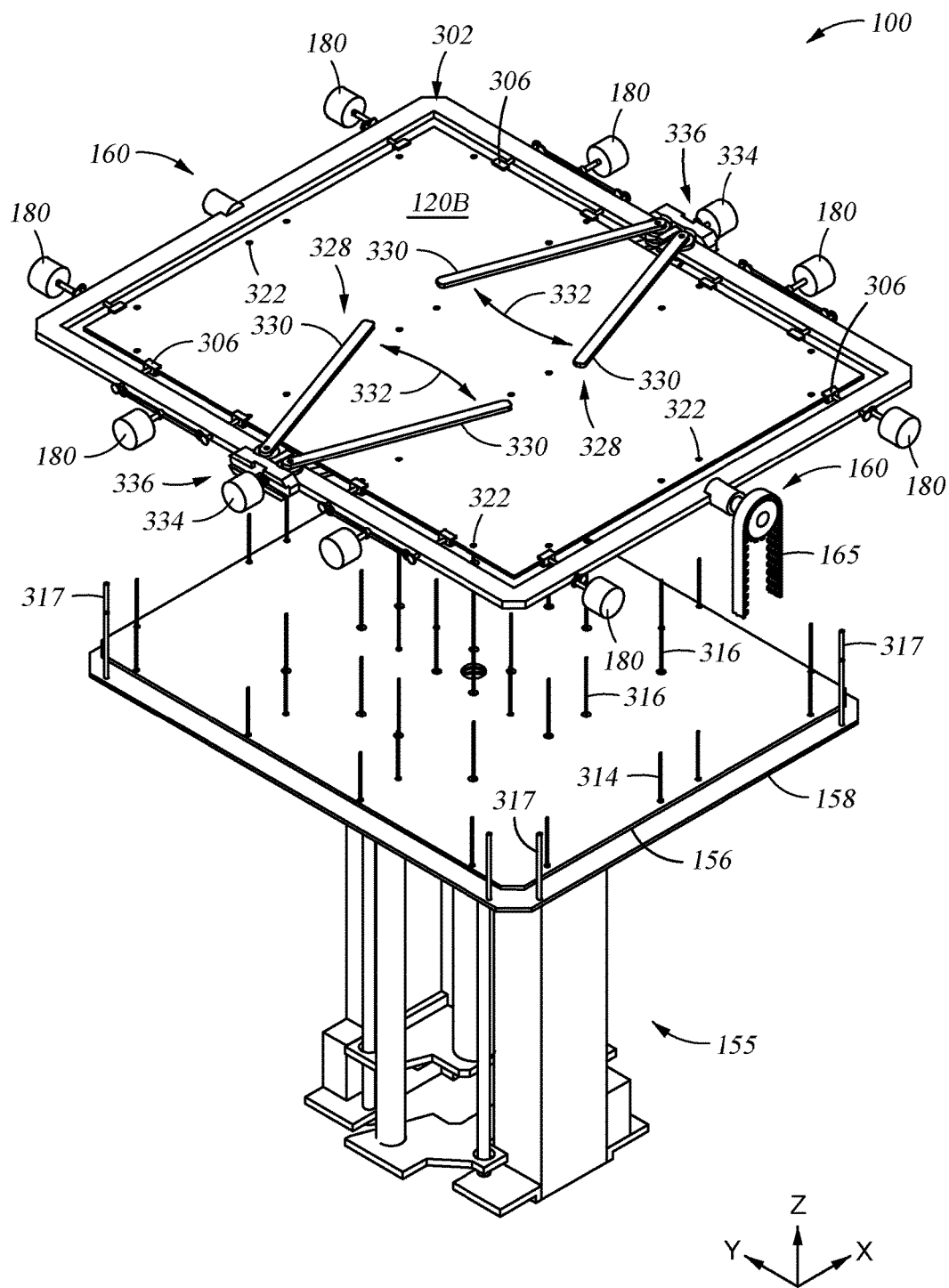
FIG. 3H shows the first carrier and the second carrier clamped into the frame by the clamps.

As the first carrier 120A is within a plane of the frame 302 as shown in FIG. 3F, the second carrier 120B may be lowered (in the Z direction) by the second lift plate 158. When the second carrier 120B is brought into proximity with the first carrier 120A, the clamps 306 may couple to each of the first carrier 120A and the second carrier 120B as shown in FIG. 3H. The clamping of the clamps 306 may be accomplished by deactivating the actuators 180.

FIG. 3H shows the first carrier 120A and the second carrier 120B clamped into the frame by the clamps 306 (the first carrier 120A is below the second carrier 120B). Additionally, in some embodiments, stabilizer assemblies 328 may be actuated to secure central areas of the first carrier 120A and the second carrier 120B. Each stabilizer assembly 328 may include blades 330 that extend from the frame 302 toward the central area of the carriers. The blades 330 may move in an arc indicated by arrow 332 from the frame 302 to the position shown in FIG. 3H. The blades 330 may be actuated by a motor 334 coupled between the frame 302 and the blades 330. The motor 334 may be coupled to a gear device 336, which may be a rack and pinion gear.

Figure 3I:
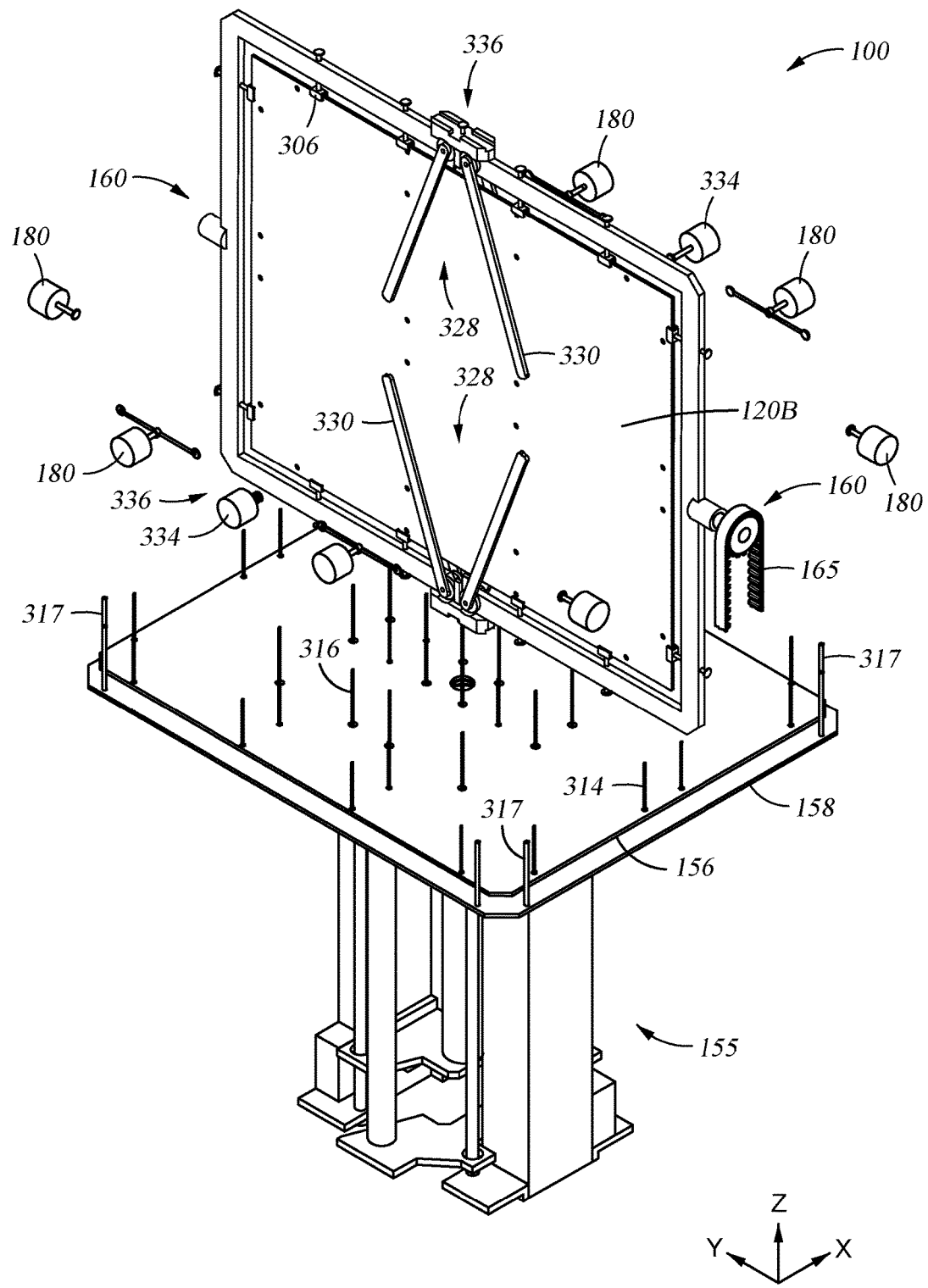
FIGS. 3I and 3J show the flipping and substrate transfer process according to embodiments described herein.
Figure 3J:
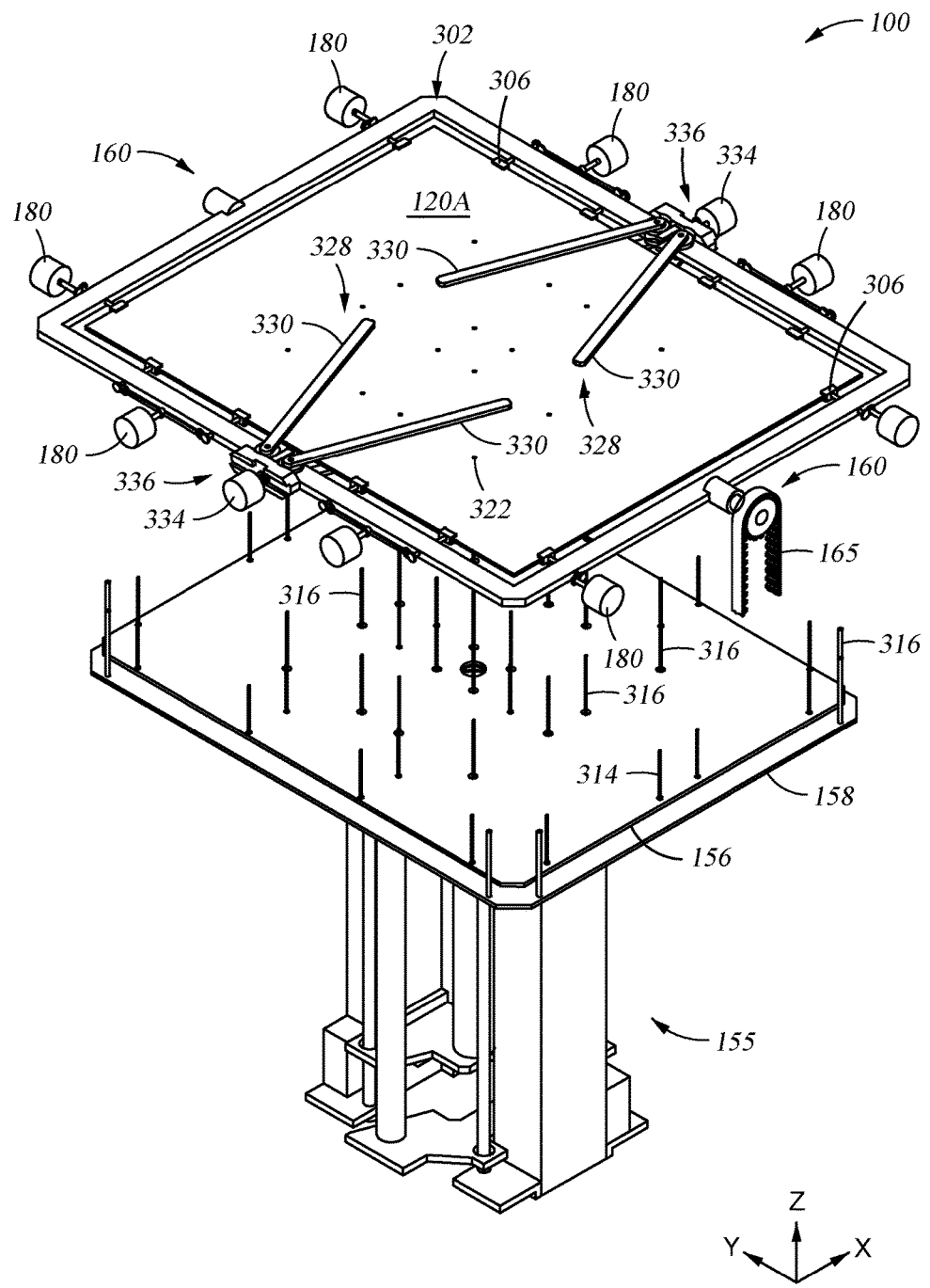

Clamping of the first carrier 120A and the second carrier 120B using the clamps 306, as well as actuation of the blades 330, prepare the first carrier 120A and the second carrier 120B for the carrier flipping and substrate transfer process as described in FIGS. 3I and 3J. As shown in FIG. 3H, the first lift plate 156 and the second lift plate 158 are actuated to a position away from the frame 302 such that the frame 302 may be rotated as described in FIGS. 3I and 3J.

FIGS. 3I and 3J show the chamber 100 without the chamber body 105 and the lid 110 (both shown in FIG. 1) in order to show the flipping and substrate transfer process. Although the actuators 180 and the motor 334 may appear as floating in the view shown in FIG. 3I, it is noted that the actuators 180 and the motor 334 may be supported by the chamber body 105 (not shown).

The first carrier 120A and the second carrier 120B are clamped as described above and one or more of the rotational drive assemblies 160 is actuated to rotate the frame 302 (with the first carrier 120A and the second carrier 120B disposed thereon). The frame 302 is rotated 180 degrees such that the second carrier 120B, previously on the upper side of the frame 302, is now positioned on the lower side of the frame 302 (below the first carrier 120A), as shown in FIG. 3J. During this flipping process, the carriers 120A and 120B change orientation (from face-up to face-down), and the substrates 125 (not shown) are transferred from the pockets 140 (not shown) of the first carrier 120A to the pockets 140 (not shown) of the second carrier 120B.

Figure 4:
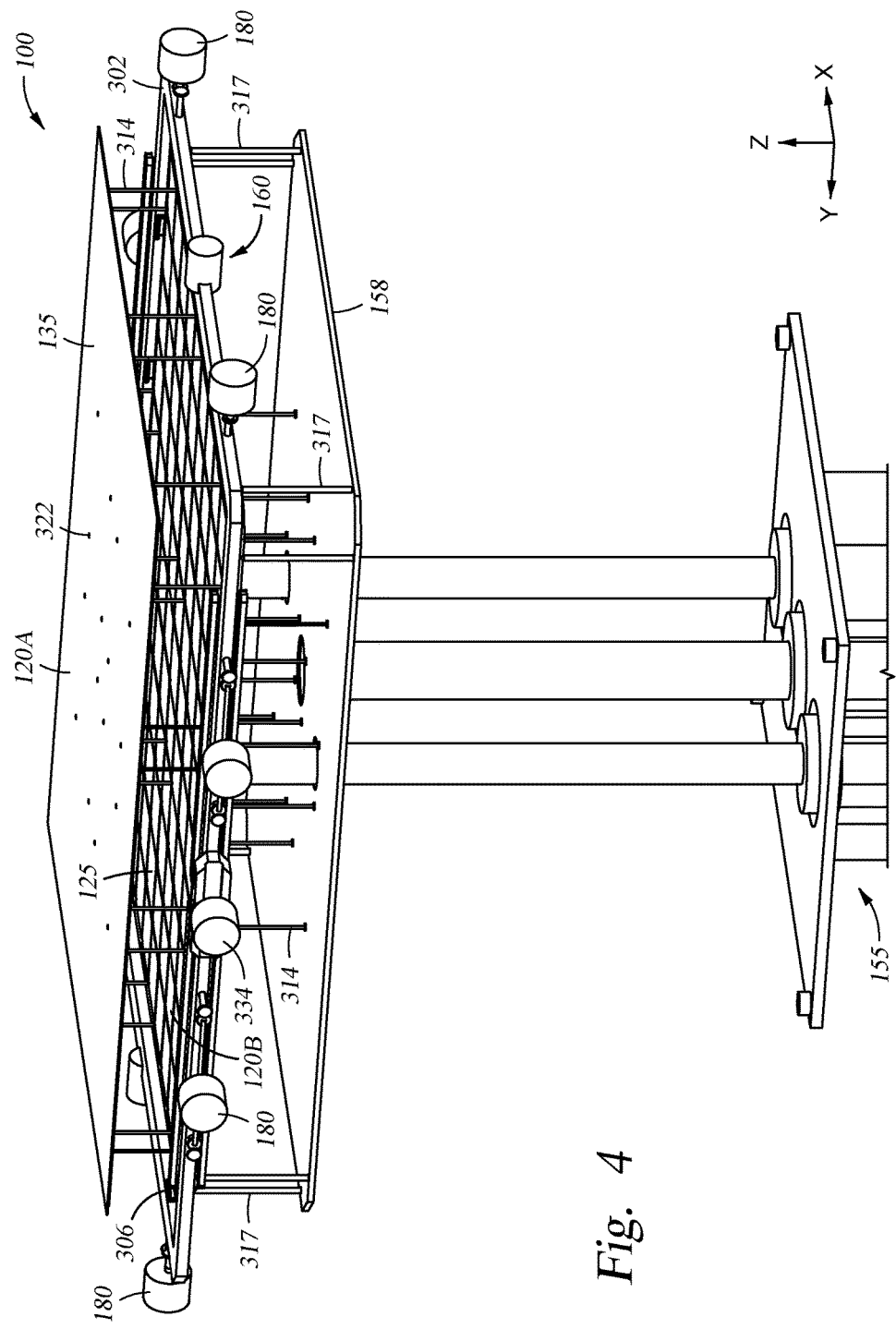
FIG. 4 shows the first carrier raised above a plane of the frame after the clamps have been actuated outward and away from the first carrier and the second carrier.
Figure 5:
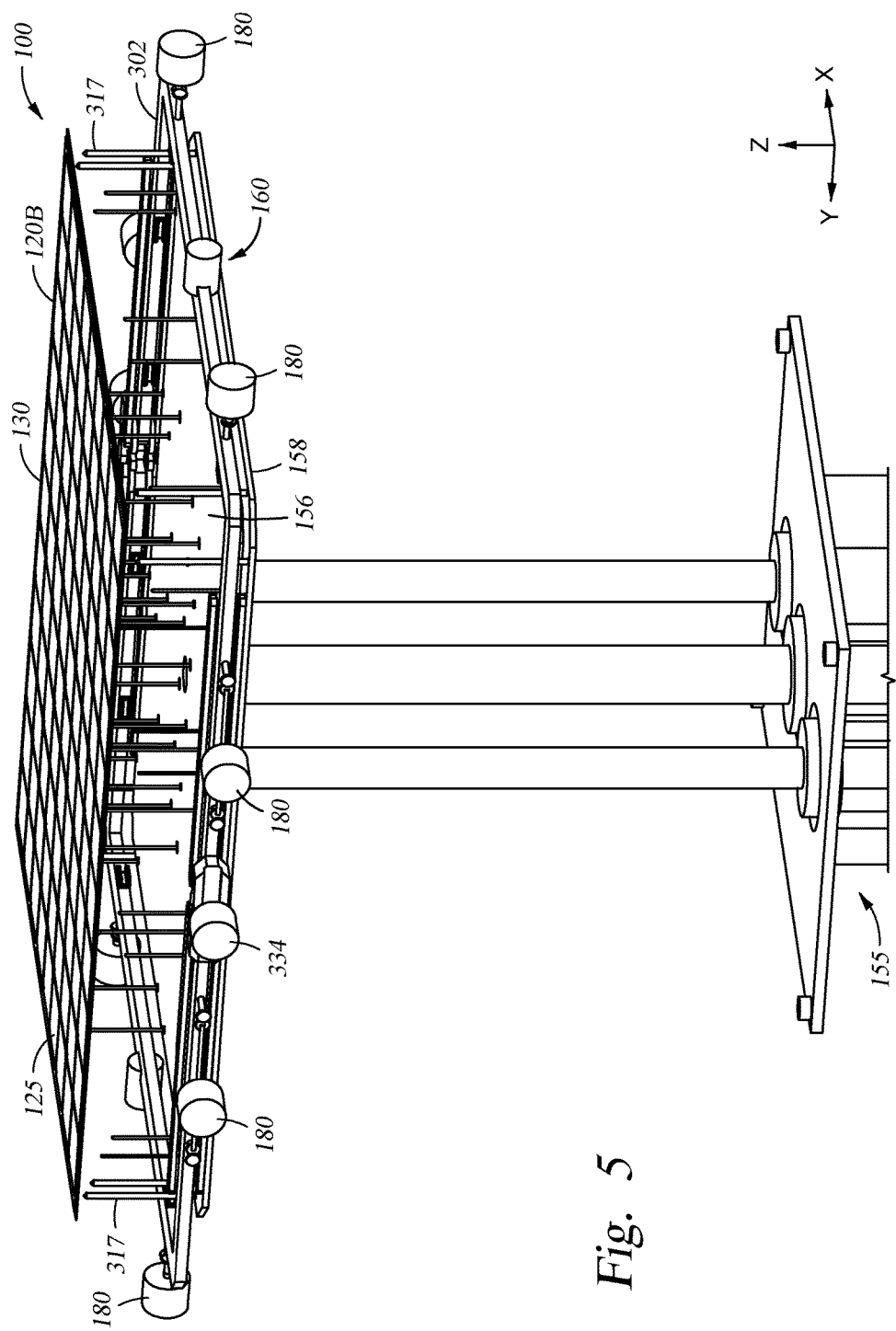
FIG. 5 shows the second carrier having the substrates thereon spaced above the plane of the frame.
Figure 6:
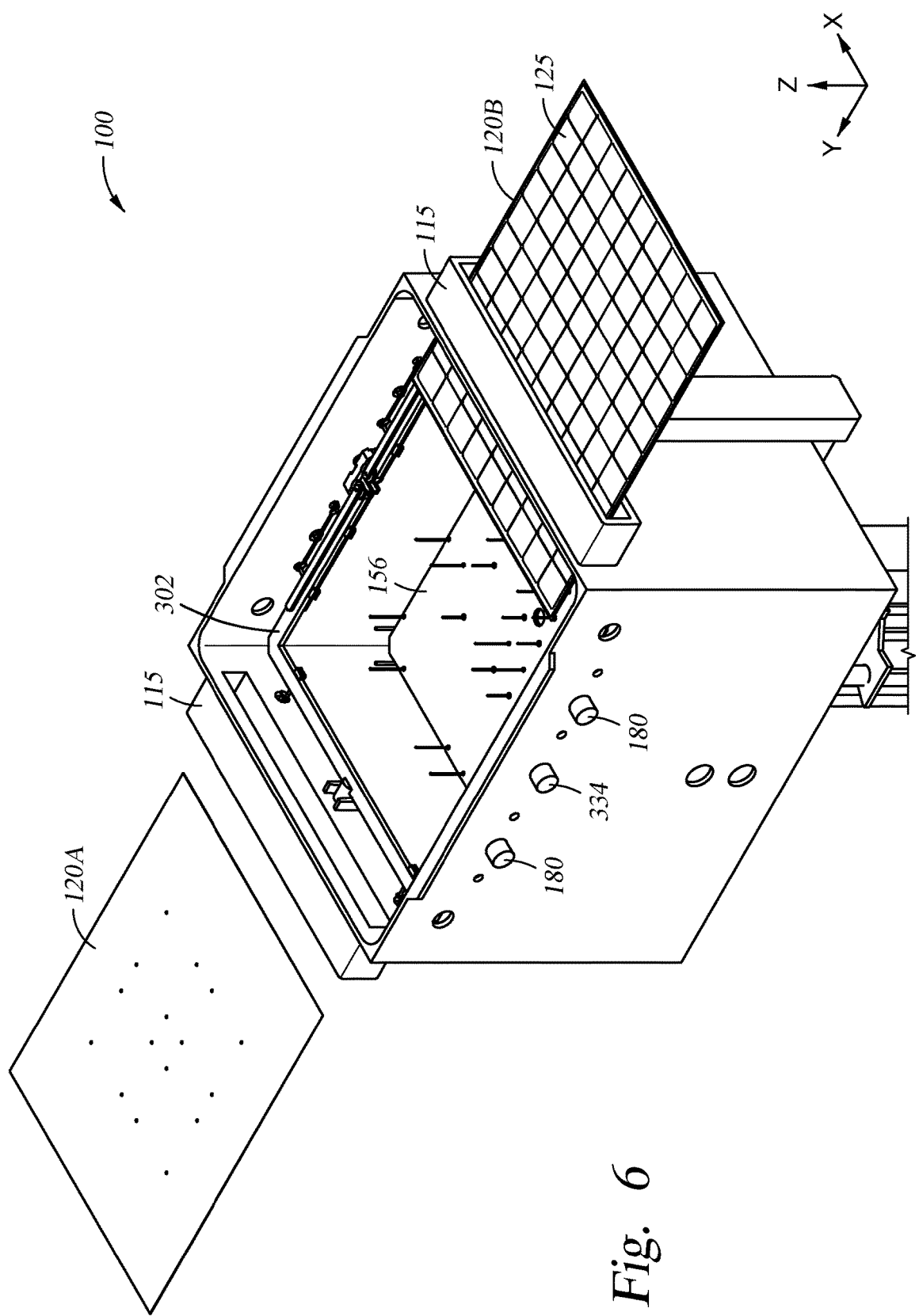
FIG. 6 shows transfer of the first carrier and the second carrier out of the chamber.

FIGS. 4, 5 and 6 are various views showing transfer of the first carrier 120A and the second carrier 120B being transferred out of the chamber 100.

FIG. 4 shows the first carrier 120A raised above a plane of the frame 302 after the clamps 306 have been actuated outward and away from the first carrier 120A and the second carrier 120B. The second carrier 120B is shown below the first carrier 120A and the second carrier 120B includes the plurality of substrates 125 from the first carrier 120A. The first carrier 120A is now empty of substrates and may be raised above the frame 302 and the second carrier 120B by the first lift plate 156. The first carrier 120A may be supported by the first lift plate 156. In this position, the first carrier 120A may be removed from the chamber 100 by a transfer robot (not shown) leaving the second carrier 120B with the substrates 125 thereon in the frame 302 as shown in FIG. 6. The second carrier 120B may be supported by the second lift plate 158.

FIG. 5 shows the second carrier 120B having the substrates 125 thereon spaced above the plane of the frame 302. The second carrier 1206 may be supported above the frame 302 by the second lift plate 158. In this position, the second carrier 120B may be removed from the chamber 100 by a transfer robot (not shown) as shown in FIG. 6.

FIG. 7 is a schematic side view of the linear drive assembly 155 coupled to the first lift plate 156 and the second lift plate 158. The second lift pins 316 are shown supporting a carrier 700A while the first lift pins 314 are shown supporting a carrier 700B. The carrier 700A is spaced apart from the carrier 700B in this Figure which may represent a carrier transfer position for the carrier 700A. For example, a gap is provided between the carrier 700B and the carrier 700A which provides ample space for a robot blade or end effector (not shown). In some embodiments, the alignment pins 317 are shorter than the second lift pins 316 of the second lift plate 158 such that the alignment pins 317 do not contact the carrier 700A when the second lift pins 316 contact the carrier 700A.

The linear drive assembly 155 may include a first actuator 705 and a second actuator 710 that moves the first lift plate 156 and the second lift plate 158. The first actuator 705 may be coupled to one or more lift shafts 715. Likewise, the second actuator 710 may be coupled to one or more lift shafts 720. In some embodiments, the first lift plate 156 is coupled to two lift shafts 715 (only one is shown in this view) and the second lift plate 158 is coupled to central lift shaft 720.

While the foregoing is directed to embodiments of the present disclosure, other and further embodiments of the disclosure may be devised without departing from the basic scope thereof, and the scope thereof is determined by the claims that follow.

The invention claimed is:
1. A chamber, comprising:
a chamber body and a lid defining an interior volume;
a frame within the interior volume, the frame sized to receive a plurality of substrates in a first orientation;
a first actuator operable to move a first clamp away from a center of the frame; and
a rotational drive assembly coupled to the frame for rotating the frame and flipping each of the plurality of substrates to a second orientation that is different than the first orientation, wherein:

the plurality of substrates are supported by a first carrier that is transferred to an inner perimeter of the frame,
a second carrier is positioned over the first carrier and the first carrier and the second carrier are received in the inner perimeter of the frame, and
the frame includes a second clamp, wherein the first and second clamps contact the first carrier during rotation of the frame, and the first actuator is disengaged from the first and second clamps during rotation of the frame.

2. The chamber of claim 1, wherein the plurality of substrates are exchanged to the second carrier in the second orientation.

3. The chamber of claim 1, further comprising a lift plate that selectively contacts one or both of the first carrier and the second carrier.

4. The chamber of claim 1, wherein the rotational drive assembly rotates the frame 180 degrees during movement between the first orientation and the second orientation.

5. A chamber, comprising:
a chamber body and a lid defining an interior volume;
a frame within the interior volume, the frame adapted to receive a first carrier having a plurality of substrates disposed therein;
a stabilizer assembly coupled to and movable with the frame, the stabilizer assembly including a blade that moves in a rotational axis across the first carrier;
a second carrier disposable over the first carrier;
a rotational drive assembly coupled to the frame for rotating the first carrier and the second carrier; and
a lift plate that selectively contacts one of the first carrier or the second carrier.

6. The chamber of claim 5, wherein the first carrier includes openings formed therethrough sized to receive a plurality of lift pins coupled to the lift plate.

7. The chamber of claim 5, further comprising a plurality of clamps coupled to an inner perimeter of the frame.

8. The chamber of claim 7, wherein each of the plurality of clamps are biased inwardly.

9. The chamber of claim 7, further comprising an actuator coupled to each of the plurality of clamps.

10. The chamber of claim 5, further comprising a stabilizer assembly adapted to secure the first carrier and the second carrier within the frame.

11. A chamber, comprising:
a chamber body and a lid defining an interior volume;
a frame within the interior volume, the frame sized to receive a first carrier having a plurality of substrates disposed in the first carrier in a face-up orientation;
one or more stabilizer assemblies coupled to and movable with the frame, each of the one or more stabilizer assemblies including a blade that moves in a rotational axis across the first carrier;
a second carrier disposable over the first carrier; and
a rotational drive assembly coupled to the frame for rotating the first carrier and the second carrier in a rotational axis relative to the chamber body.

12. The chamber of claim 11, further comprising a plurality of clamps coupled to an inner perimeter of the frame.

13. The chamber of claim 12, wherein each of the plurality of clamps are biased inwardly.

14. The chamber of claim 12, further comprising an actuator coupled to each of the plurality of clamps.

15. The chamber of claim 11, further comprising a lift plate that selectively contacts one or both of the first carrier and the second carrier.

16. The chamber of claim 15, wherein the lift plate is coupled to a drive assembly.

* * * * *